United States Patent
Cho et al.

(10) Patent No.: US 9,171,784 B2
(45) Date of Patent: Oct. 27, 2015

(54) DUAL POWER CONVERTER PACKAGE USING EXTERNAL DRIVER IC

(71) Applicant: International Rectifier Corporation, El Segundo, CA (US)

(72) Inventors: Eung San Cho, Torrance, CA (US); Dan Clavette, Greene, RI (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/759,831

(22) Filed: Feb. 5, 2013

(65) Prior Publication Data
US 2013/0256859 A1    Oct. 3, 2013

Related U.S. Application Data

(60) Provisional application No. 61/616,949, filed on Mar. 28, 2012.

(51) Int. Cl.
  *H01L 23/495* (2006.01)
  *H01L 23/00* (2006.01)

(52) U.S. Cl.
  CPC ........ *H01L 23/495* (2013.01); *H01L 23/49524* (2013.01); *H01L 23/49562* (2013.01); *H01L 23/49575* (2013.01); *H01L 24/34* (2013.01); *H01L 24/49* (2013.01); *H01L 2224/48247* (2013.01); *H01L 2224/49111* (2013.01); *H01L 2224/73221* (2013.01); *H01L 2924/13064* (2013.01); *H01L 2924/13091* (2013.01); *H01L 2924/30107* (2013.01)

(58) Field of Classification Search
  USPC ......... 257/666, 676, 690, 691, 692, 693, 730, 257/731, 733
  See application file for complete search history.

(56) References Cited

U.S. PATENT DOCUMENTS

| | | | |
|---|---|---|---|
| 2005/0218876 A1* | 10/2005 | Nino | 323/282 |
| 2008/0251912 A1 | 10/2008 | Otremba | |
| 2009/0218683 A1* | 9/2009 | Satou et al. | 257/723 |

FOREIGN PATENT DOCUMENTS

| | | |
|---|---|---|
| TW | 200510875 | 3/2005 |
| TW | 200910555 | 3/2009 |
| TW | 201125250 | 7/2011 |

* cited by examiner

*Primary Examiner* — A. Sefer
*Assistant Examiner* — Dilinh Nguyen
(74) *Attorney, Agent, or Firm* — Farjami & Farjami LLP

(57) ABSTRACT

A dual power converter package is disclosed. The package includes a leadframe having a first control FET paddle configured to support a drain of a first control FET, and a second control FET paddle configured to support a drain of a second control PET. The leadframe further includes a sync FET paddle configured to support a source of a first sync FET and a source of a second sync FET, and a first plurality of contacts configured to receive control signals for each of the control PETS and each of the sync FETs from a driver integrated circuit (IC) external to the leadframe. The leadframe may additionally include first and second switched nodes, configured for electrical connection to the first control FET and the first sync FET via a first clip, and to the second control PET and the second sync PET via a second clip, respectively.

16 Claims, 4 Drawing Sheets

DUAL POWER CONVERTER PACKAGE USING EXTERNAL DRIVER IC

BACKGROUND

The present application claims the benefit of and priority to a pending provisional patent application entitled "Dual Phase Power Converter Package and Integration," Ser. No. 61/616,949 filed on Mar. 28, 2012. The disclosure in that pending provisional application is hereby incorporated fully by reference into the present application.

As electronic devices decrease in size, internal electrical circuit packages are, likewise, required to decrease in size as well as offer increased current density and current capacity. In addition, many electronic devices require multiple internal power supply voltages. However, conventional power supply designs, such as conventional buck converters, typically include a half-bridge circuit controlled by a dedicated control IC. Thus, multiple internal power supplies typically require multiple half-bridge circuits, each controlled by a respective control IC. However, conventional power supply packages including a single half-bridge circuit and a dedicated control IC require a physical layout considerably larger than either the half-bridge circuit or dedicated control IC alone. Consequently, utilizing multiple conventional power supply packages can be very space-inefficient, while also having undesirably low current and power densities as well as requiring a larger physical layout within the electronic device.

SUMMARY

The present disclosure is directed to a dual power converter package using external driver IC, substantially as shown in and/or described in connection with at least one of the figures, as set forth more completely in the claims.

DETAILED DESCRIPTION

Figure 1:
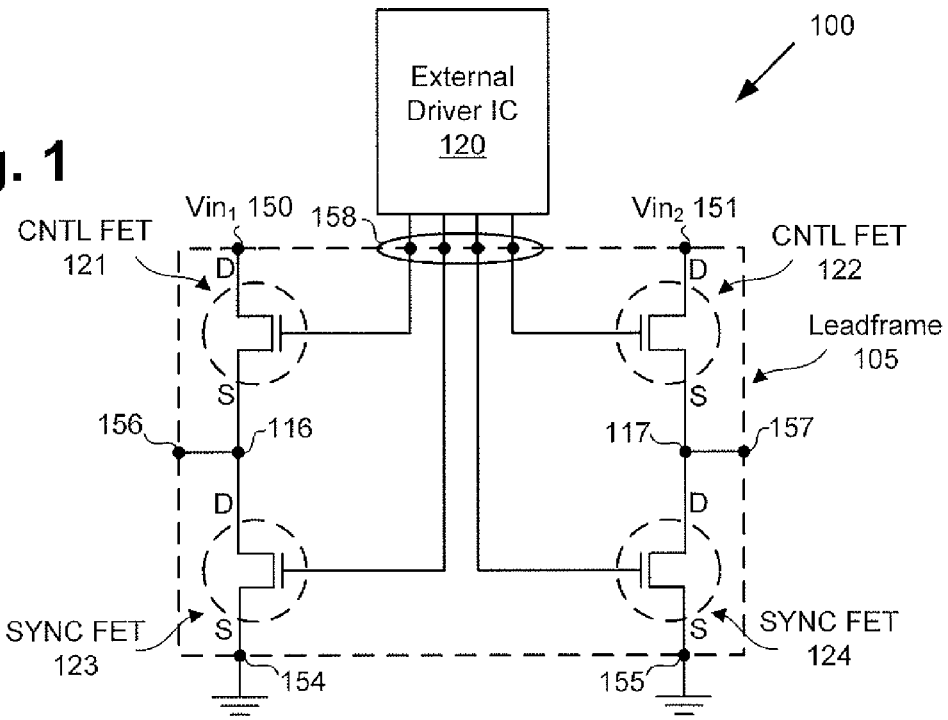
FIG. 1 presents an exemplary diagram of a first half-bridge circuit and a second half-bridge circuit of a dual power converter package, in accordance with one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 presents an exemplary diagram of a first half-bridge circuit and a second half-bridge circuit of a dual power converter package, in accordance with one implementation of the present application. Dual power converter package 100 includes leadframe 105 and may include external driver IC 120 electrically connected to leadframe 105 through one or more of a plurality of contacts 158. The first half-bridge circuit may include Control (CNTL) FET 121 having its drain terminal electrically connected to input power supply $Vin_1$ 150 and its source terminal electrically connected to a drain terminal of Synchronous (SYNC) FET 123 to provide switched node 116. The source of SYNC FET 123 may be connected to ground through ground contact 154 of leadframe 105. A first output voltage may be provided from switched node 116 at output voltage contact 156 on leadframe 105.

Likewise, the second half-bridge circuit may include CNTL FET 122 having its drain terminal electrically connected to input power supply $Vin_2$ 151 and its source terminal electrically connected to a drain terminal of SYNC FET 124 to provide switched node 117. The source of SYNC FET 123 may be connected to ground through ground contact 155 of leadframe 105. A second output voltage may be provided on leadframe 105 from switched node 117 at output voltage contact 157. In addition, external driver IC 120 may be located external to leadframe 105 any may be configured to control the operation of the CNTL FETs and SYNC FETs in the first and second half-bridge circuits to, among other things, produce the desired output voltage at switched nodes 116 and 117. The half-bridge circuits will become part of a buck converter to convert input voltages $Vin_1$ and $Vin_2$ to output voltages at output voltage contacts 156 and 157, respectively, under control of external driver IC 120.

CNTL FETs and the SYNC FETs may be power MOSFETs (metal oxide semiconductor FETs), or power HEMTs (high electron mobility transistors). A Group III-V HEMT, such as a Group III-N HEMT or more specifically a GaN HEMT can be used for the CNTL FETs and the SYNC FETs. Alternatively, a Group III-V FET, such as a Group III-N FET or more specifically a GaN FET can be used for CNTL FET and SYNC FET.

Figure 2:
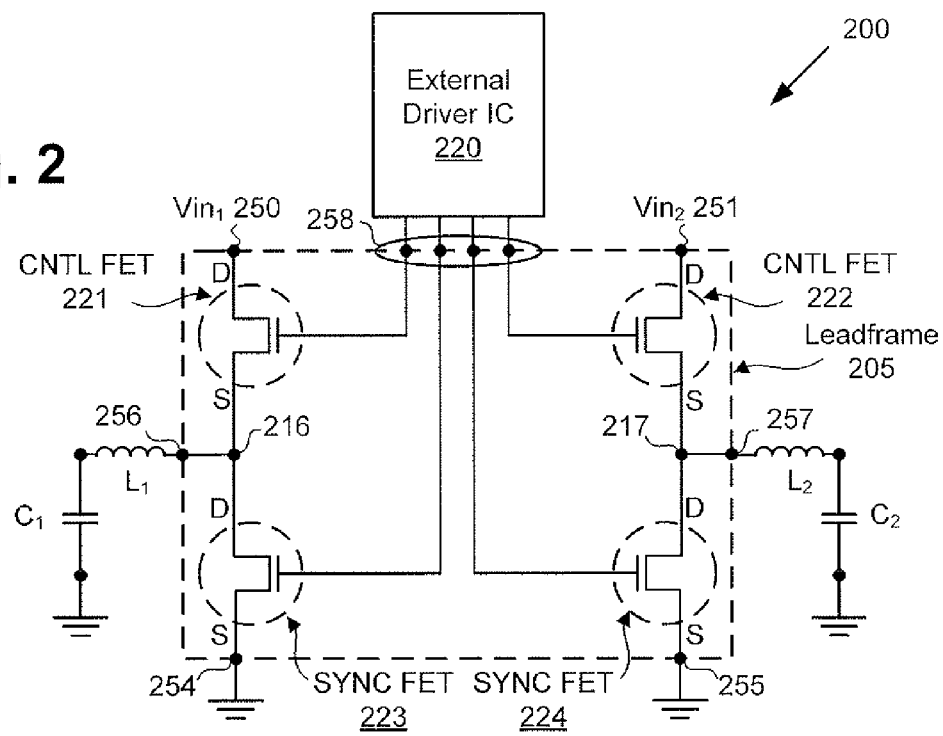
FIG. 2 presents an exemplary diagram of a first half-bridge circuit and a second half-bridge circuit of a dual power converter package, in accordance with another implementation of the present application.

FIG. 2 presents an exemplary diagram of a first half-bridge circuit and a second half-bridge circuit of a dual power converter package, in accordance with another implementation of the present application. Dual power converter package 200 is substantially the same as package 100 of FIG. 1, except further including an inductive/capacitive load connected to the voltage output voltage contacts of the leadframe. Dual power converter package 200 includes leadframe 205 and may include external driver IC 220 electrically connected to leadframe 105 through one or more of a plurality of contacts 158. The first half-bridge circuit includes CTRL FET 221 having its drain terminal electrically connected to input power supply Vim 250 and its source terminal electrically connected to a drain terminal of SYNC FET 223 providing switched node 216. The source of SYNC FET 223 may be connected to ground through ground contact 254 of leadframe 205. A first output voltage may be provided from switched node 216 at output voltage contact 256 on leadframe 205. Inductance $L_1$ and capacitance $C_1$ may be electrically connected in series between output voltage contact 256 and ground in order to provide smoothing of the switched output at output voltage contact 256.

Likewise, the second half-bridge circuit may include CNTL FET 222 having its drain terminal electrically connected to input power supply $Vin_2$ 251 and its source terminal electrically connected to a drain terminal of SYNC FET 224 to provide switched node 217. The source of SYNC PET 223 may be connected to ground through ground contact 255 of leadframe 205. A second output voltage may be provided from switched node 217 at output voltage contact 257 on leadframe 205. In addition, external driver IC 220 may be located external to leadframe 205 and may be configured to control the operation of the CNTL FETs and SYNC FETs in the first and second half-bridge circuits to, among other things, produce the desired output voltage at switched nodes 216 and 217. Inductance $L_2$ and capacitance $C_2$ may be electrically connected in series between output voltage contact 257 and ground in order to provide smoothing of the switched output at output voltage contact 257. The half-bridge circuits will become part of a buck converter to convert input voltages $Vin_1$ and $Vin_2$ to output voltages at output voltage contacts 256 and 257, respectively, under control of external driver IC 220.

Figure 3A:
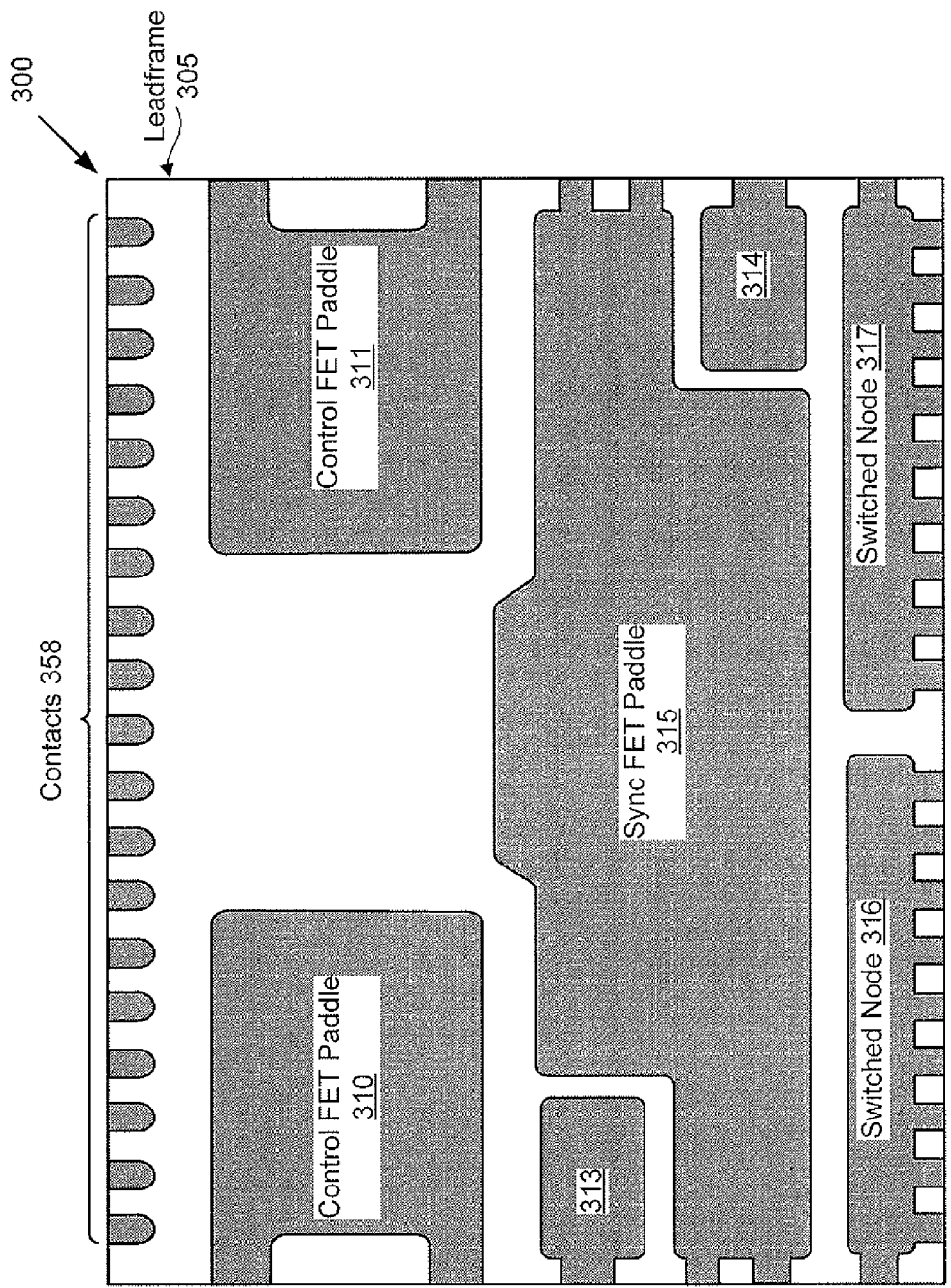
FIG. 3A presents an exemplary top view of a dual power converter package, in accordance with one implementation of the present application.
Figure 3B:
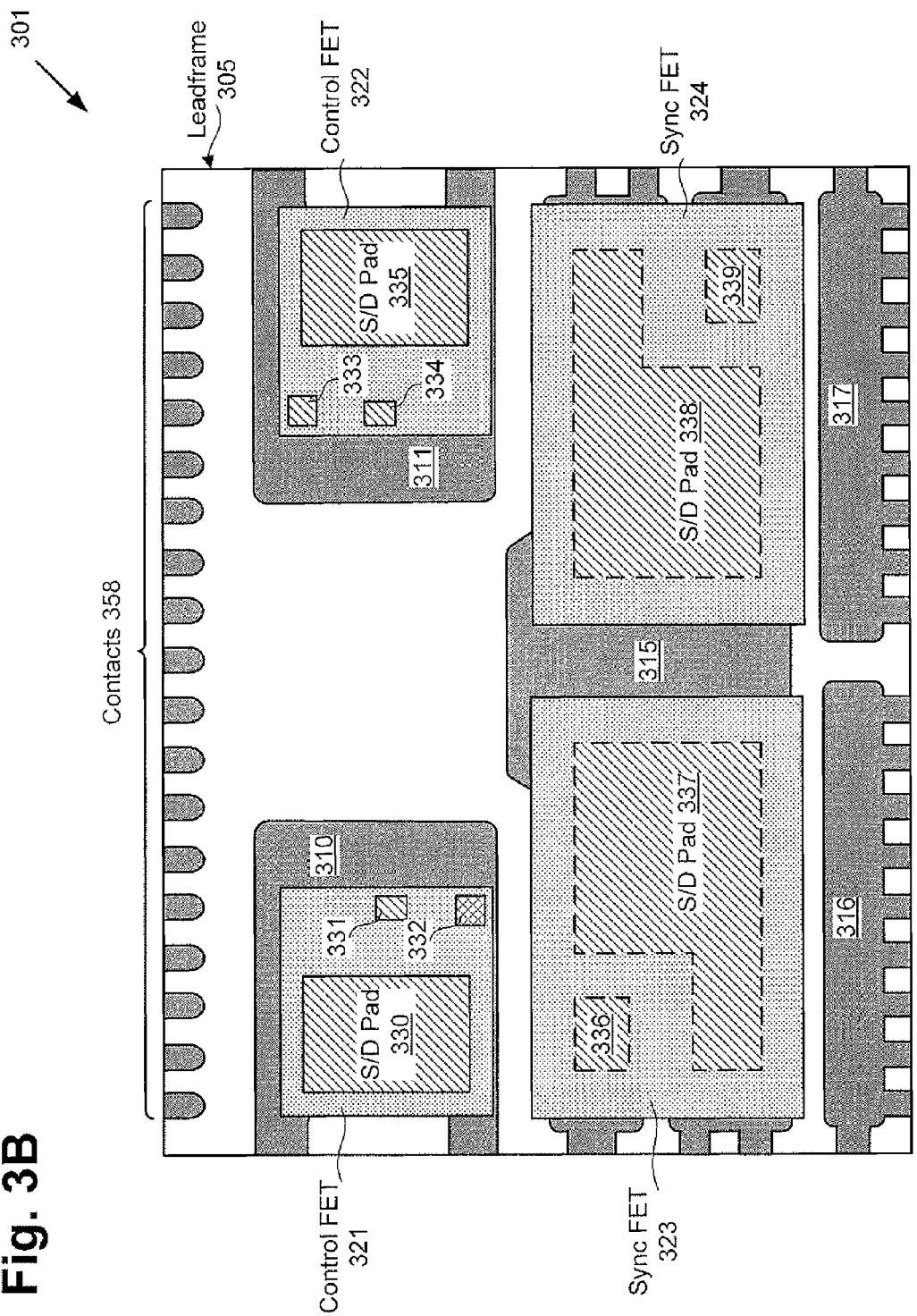
FIG. 3B presents an exemplary top view of a dual power converter package including first and second Control FETs and first and second Sync FETs, in accordance with one implementation of the present application.
Figure 3C:
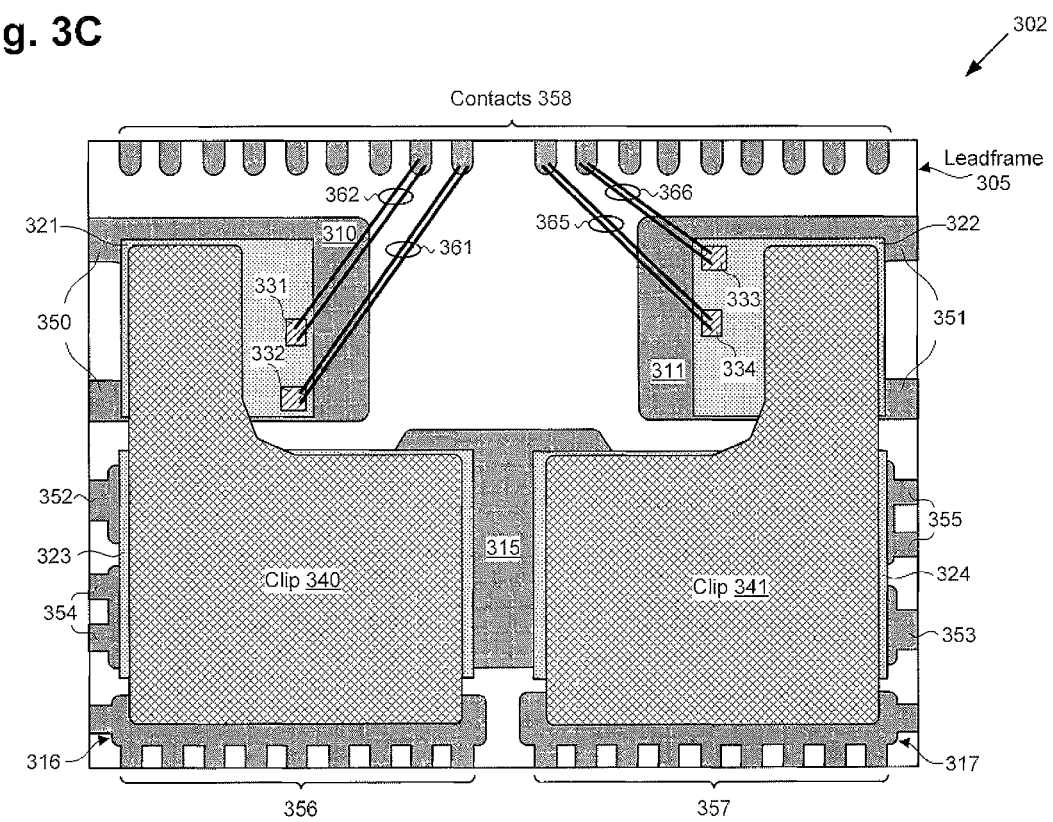
FIG. 3C presents an exemplary top view of a dual power converter package including first and second half-bridge circuits, in accordance with one implementation of the present application.

An exemplary implementation of the present application is further shown in FIGS. 3A, 3B and 3C. FIG. 3A presents an exemplary top view of a dual power converter package, in accordance with one implementation of the present application. Package 300 in FIG. 3A includes leadframe 305 on which is fabricated CNTL FET paddle 310 configured to support a drain of a CNTL FET, such as CNTL FET 121 or 221 for example. CNTL FET paddle 311 is configured to support a drain of another CNTL FET, such as CNTL FET 122 or 222 for example. Leadframe 305 may additionally include a plurality of contacts 358 configured to provide external connection for one or more voltages, and/or one or more control signals for each of the CNTL FETs and SYNC FETs from an external control IC, such as External Control IC 120 or 220 for example. SYNC PET paddle 315 is configured to support at least a source of a first SYNC FET and at least a source of a second SYNC FET, such as SYNC FETs 123 and 124 or 223 and 224, respectively. CNTL FET paddles 310 and 311 may be substantially symmetrically fabricated and disposed on leadframe 305. Gate paddles 313 and 314 may be configured to support at least a gate of the first and second SYNC FETs, respectively. Switched node 316 may be configured for electrical connection to the source of a CNTL FET and the drain of a SYNC FET within the first half-bridge circuit via a trace, connector, clip, ribbon or wire. Likewise, switched node 317 may be configured for electrical connection to the source of a CNTL FET and the drain of a SYNC FET of the second half-bridge circuit via another trace, connector, clip, ribbon or wire.

FIG. 3B presents an exemplary top view of a dual power converter package including first and second Control FETs, and first and second Sync FETs, in accordance with one implementation of the present application. FIG. 3B may be substantially the same as FIG. 3A, however, additionally including the following elements. Package 301 may include CNTL FET 321 disposed on CNTL FET paddle 310. Shown in FIG. 3B are source sense pad 331, gate 332, and source/drain 330 on a top side of CNTL FET 321. A drain may be disposed on a bottom side of CNTL FET 321.

Likewise, CNTL FET 322 may be disposed on CNTL FET paddle 311 and may have source sense pad 334, gate 333, and source/drain 335 on its top side and a drain on its bottom side. SYNC FETs 323 and 324 may each be disposed on SYNC FET paddle 315. Gate 336 and a source/drain 337 may be disposed on the bottom side of SYNC FET 323, while gate 336 and source/drain 338 may be disposed on the bottom side of SYNC FET 324 as denoted by the dotted outlines. Additionally a drain may be disposed on a top side of each of SYNC FETs 323 and 324. Each of the gate pads may be configured to rest on a respective one of gate paddles 313 and 314, and each of the source/drain pads may be configured to rest on SYNC FET paddle 315. Finally an external Driver IC may be disposed externally to leadframe 305 and may be configured to remotely control each of the CNTL FETs and each of the SYNC FETs. In one implementation, such an external Driver IC may be configured to control more than one dual power converter package.

FIG. 3C presents an exemplary top view of a dual power converter package including first and second half-bridge circuits, in accordance with one implementation of the present application. FIG. 3C may be substantially the same as FIG. 3B, however, additionally including the following elements.

Package 302 may include clip 340 disposed on CNTL FET 321 and SYNC FET 323 and configured to electrically connect the source of CNTL FET 321 and the drain of SYNC FET 323 to switched node 316. Likewise, clip 341 may be disposed on CNTL FET 322 and SYNC FET 324 and is configured to electrically connect the source of CNTL FET 322 and the drain of SYNC FET 324 to switched node 317. In this manner, CNTL FET 321 and SYNC FET 323 form a half-bridge suitable for, by way of example, use in a buck converter. Likewise, CNTL FET 322 and SYNC FET 324 form another half-bridge for use in, for example, another buck converter.

Switched node 316 can then be provided to, for example, an inductive/capacitive load (not shown) of a buck converter (not shown) through output voltage contacts 356, which may be formed as portions of switched node 316. Likewise, switched node 317 can then be provided to, for example, an inductive/capacitive load (not shown) of a buck converter (not shown) through output voltage contacts 357, which may be formed as portions of switched node 317.

In the present implementation an external Driver IC is shared and controls both half-bridges through electrical connection to one or more of contacts 358 on leadframe 305 by one or more wires and/or interconnects. More specifically, interconnects 361 may provide control signals from the external driver IC to gate 332 of CNTL FET 321 through one or more of contacts 358, while interconnects 362 are used to sense current at source sense pad 331 of CNTL FET 321 through one or more of contacts 358. Since CNTL FET paddle 310 is configured to support the drain of CNTL FET 321, $Vin_1$ may be provided to CNTL FET paddle 310 at supply voltage contacts 350, which may be formed as a portion of CNTL FET paddle 310. Thus, interconnect 360 may provide input supply voltage $Vin_1$ to the external Driver IC through CNTL FET paddle 310.

Likewise, interconnects 366 may provide control signals from the external Driver IC to gate 333 of CNTL FET 322 through one or more of contacts 358, while interconnects 365 are used to sense current at source sense pad 334 of CNTL FET 322 through one or more of contacts 358. Since CNTL FET paddle 311 is configured to support the drain of CNTL FET 322, $Vin_2$ may be provided to CNTL FET paddle 311 at supply voltage contacts 351, which may be formed as a portion of CNTL FET paddle 311. Thus, interconnect 364 may provide input supply voltage $Vin_2$ to external driver IC 320 through CNTL FET paddle 311. Because gates 336 and 339 are disposed on the bottom side of SYNC FETs 323 and 324, respectively, control signals from the external Driver IC may be electrically connected directly to gate contacts 352 and 353, respectively. In one alternative, control signals from the external Driver IC may be electrically connected to one or more of contacts 358, which are in turn electrically connected to gate contacts 352 and 353. In addition, a ground connection may be provided to SYNC FET paddle 315 at ground contacts 354 and ground contacts 355, which may be formed as portions of SYNC FET paddle 315.

The above-described exemplary implementations of the present application result in a smaller form factor and packaging integration by housing two half-bridge circuits, each containing a CNTL FET and SYNC FET in the same package, such that each switched node output can be provided to an inductive/capacitive load to operate two separate buck converters. Moreover, the above-described implementation results in higher current density and current handling capability.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A dual power converter package comprising:
   a leadframe comprising:
   a first control FET paddle configured to support a drain of a first control FET;
   a second control FET paddle configured to support a drain of a second control FET;
   a sync FET paddle configured to support a source of a first sync FET and a source of a second sync FET;
   said first control PET and said first sync FET forming a first half-bridge circuit, and said second control FET and said second sync FET forming a second half-bridge circuit;
   a first plurality of contacts configured to receive control signals for said first and second control FETs and said first and second sync FETs from a driver integrated circuit (IC) external to said leadframe.

2. The dual power converter package of claim 1, further comprising a first switched node configured for electrical connection to a source of said first control FET and a drain of said first sync FET via a first trace, connector, clip, ribbon, or wire.

3. The dual power converter package of claim 2, further comprising a second switched node configured for electrical connection to a source of said second control FET and a drain of said second sync FET via a second trace, connector, clip, ribbon, or wire.

4. The dual power converter package of claim 3, wherein said leadframe further comprises a first output voltage contact configured to provide a first output voltage from said first switched node.

5. The dual power converter package of claim 4, wherein said leadframe further comprises a second output voltage contact configured to provide a second output voltage from said second switched node.

6. The dual power converter package of claim 1, wherein said first control FET paddle and said second control FET paddle are disposed substantially symmetrically on said leadframe.

7. The dual power converter package of claim 1, wherein said leadframe further comprises a first supply voltage contact configured for externally receiving a first supply voltage.

8. The dual power converter package of claim 7, wherein said leadframe further comprises a second supply voltage contact configured for externally receiving a second supply voltage.

9. The dual power converter package of claim 1, wherein said leadframe further comprises a ground contact for externally receiving a ground connection.

10. A dual power converter package comprising:
    a leadframe comprising:
    a first control FET disposed on a first control FET paddle;
    a second control FET disposed on a second control FET paddle;
    a first sync FET and a second synch FET, each disposed on a sync FET paddle;
    said first control FET and said first sync FET forming a first half-bridge circuit, and said second control FET and said second sync PET forming a second half-bridge circuit;
    a first plurality of contacts configured to receive control signals for said first and second control FETs and said first and second sync FETs from a driver integrated circuit (IC) external to said leadframe.

11. The dual power converter package of claim 10, wherein said leadframe further comprises a first switched node configured for electrical connection to a source of said first control FET and a drain of said first sync FET via a first trace, connector, clip, ribbon, or wire.

12. The dual power converter package of claim 11, wherein said leadframe further comprises a second switched node configured for electrical connection to a source of said second control FET and a drain of said second sync FET via a second trace, connector, clip, ribbon, or wire.

13. The dual power converter package of claim 12, wherein said leadframe further comprises:
    a first output voltage contact configured to provide a first output voltage from said first switched node;
    a second output voltage contact configured to provide a second output voltage from said second switched node.

14. The dual power converter package of claim 10, wherein:
    said first control FET is connected to a first supply voltage through said first control FET paddle;
    said second control FET is connected to a second supply voltage through said
    second control FET paddle.

15. The dual power converter package of claim 10, wherein said first sync FET and said second sync FET are connected to ground through said sync FET paddle.

16. The dual power converter package of claim 10, wherein said driver IC external to said leadframe is configured to sense a current through said first control FEF and/or a current through said second control FET.

* * * * *